United States Patent [19]

Ono

[11] 4,349,779
[45] Sep. 14, 1982

[54] VOLUME CONTROL APPARATUS
[75] Inventor: Sadao Ono, Toda, Japan
[73] Assignee: Clarion Co., Ltd., Tokyo, Japan
[21] Appl. No.: 228,645
[22] Filed: Jan. 26, 1981
[30] Foreign Application Priority Data
  Jan. 25, 1980 [JP] Japan ................................ 55-8275[U]
[51] Int. Cl.³ .......................... H03K 5/19; H03G 5/02
[52] U.S. Cl. .................... 323/318; 179/1 VL; 328/44
[58] Field of Search ............... 179/1 VL; 307/222 R; 323/318, 349, 904, 909; 328/44

[56] References Cited
U.S. PATENT DOCUMENTS
  4,016,432  4/1977  Marzalek ...................... 307/222 R
  4,292,467  9/1981  Odlen et al. ................... 179/1 VL Primary Examiner—A. D. Pellinen
Attorney, Agent, or Firm—Blanchard, Flynn, Thiel, Boutell & Tanis

[57] ABSTRACT

A volume control apparatus wherein a digital output from an up/down counter having a clock input terminal and an up/down control terminal is converted into an analog output by a D/A converter and used as a control input to an electronic attenuator. A rotary pulse generator produces a pulse each time it is rotated through a given operating rotation angle at either a first output terminal or a second output terminal, according to the operating direction. The output terminals are coupled to input terminals of the logic circuit, respectively, an output terminal of the logic circuit is coupled to a clock input terminal of the up/down counter, and the second output terminal is coupled to another input terminal of the logic circuit and to an up/down control terminal of the up/down counter.

5 Claims, 2 Drawing Figures

VOLUME CONTROL APPARATUS

BACKGROUND OF THE INVENTION

1. Field of the Invention

This invention relates to a volume control apparatus using an electronic attenuator, and more particularly to a volume control apparatus which is capable of adjusting the speed of volume control, i.e., volume increase or decrease rapidly or slowly according to operation of an operating knob.

2. Description of Prior Art

There has been widely known a volume control apparatus using an electronic attenuator as illustrated in FIG. 1. In the figure, 1 is an electronic attenuator having an audio input terminal IN, an audio output terminal OUT and a control terminal C, 2 is a D/A converter for applying a control analog signal to the control terminal C, and 3 is an up/down counter for applying a digital signal to the D/A converter 2 which has a clock input terminal CL, an up/down control terminal U/D and a carry terminal CA where an output appears at a maximum count value and at a minimum count value. 4 is a volume increasing switch comprised of a normally opened contact which is grounded at one end thereof and connected at another end thereof to a power souce B through a resistor $R_1$. 5 is a volume decreasing switch comprised of a normally opened switch which is grounded at one end thereof and connected at another end thereof to the power source B through a resistor $R_2$. Junction points between the resistor $R_1$ and the switch 4 and between the resistor $R_2$ and the switch 5, respectively, are coupled to input terminals of a logic circuit (NAND circuit) 6, respectively. An output terminal of this logic circuit 6 is coupled to an input terminal of an oscillatory circuit 8 through an inverter 7. An output terminal of this oscillatory circuit 8 is coupled to the clock input terminal CL of the up/down counter 3 through an inverter 9. A junction point between the volume decreasing switch 5 and the logic circuit 6 is coupled to the up/down control terminal U/D of the up/down counter 3. The oscillatory circuit 8 includes a NAND circuit 81 and is adapted to stop oscillation where a signal from the carry terminal CA of the up/down counter 3 is applied to the NAND circuit 81.

The operation of this conventional volume control apparatus will now be described. When the volume increasing switch 4 is closed, a level of an input to the logic circuit 6 becomes low and a level of an output of the logic circuit 6 becomes high. This output is made low by the inverter 7 so that the oscillatory circuit 8 starts oscillation to apply an oscillation output to the clock input terminal CL of the up/down counter 3. The up/down control terminal U/D is at a high level so that the up/down counter 3 counts the oscillation output in the adding direction. The count output is converted into an analog output by the D/A converter 2. A voltage of a signal to the control terminal C of the electronic attenuator 1 is increased and an amount of attenuation by the attenuator 1 is decreased, so that an output from the audio output terminal OUT is increased. On the other hand, when the volume decreasing switch 5 is closed, the oscillatory circuit starts oscillation to apply an oscillation output to the clock input terminal CL and render the up/down control terminal U/D to be of low level. As a result, the up/down counter 3 counts the oscillation output in the subtracting direction. A voltage of a signal to the control terminal C of the electronic attenuator 1 is decreased and the amount of attenuation is increased, so that an output from the audio output terminal OUT is decreased.

As apparent from the foregoing description, in the conventional volume control apparatus, the counting speed of the up/down counter 3 is determined by an oscillation period of the oscillatory circuit 8 and the amount of volume increase or decrease depends upon the closing time of the volume increasing or decreasing switch 4 or 5. Thus, it has not been able for the operator to attain quick or slow volume control as desired.

OBJECTS OF THE INVENTION

It is therefore an object of the present invention to provide an improved volume control apparatus which is capable of obviating the aforesaid disadvantage of the conventional volume control apparatus.

It is another object of the present invention to provide an improved volume control apparatus which is capable of effecting quick or slow volume control by operating a volume control operating knob.

SUMMARY OF THE INVENTION

In accordance with the present invention, there is provided a volume control apparatus which comprises:
an up/down counter having a clock input terminal and an up/down control terminal;
a D/A converter for converting a digital output from said counter into an analog output;
an attenuator responsive to said analog output for controlling an attenuation amount of an input signal;
a pulse generator having a first output terminal, a second output terminal and a pulse generating amount control means and adapted to produce a pulse from said first or second output terminal according to the operating direction of said pulse generation amount control means every given operation amount of said means; and
a logic circuit coupled to said first and second output terminals of the pulse generator for supplying a pulse from either one of said output terminals to said clock input terminal of said counter and supplying an up/down control signal to said up/down control terminal in response to the pulse appearing at said first or second output terminal.

DESCRIPTION OF THE EMBODIMENT

Figure 1:
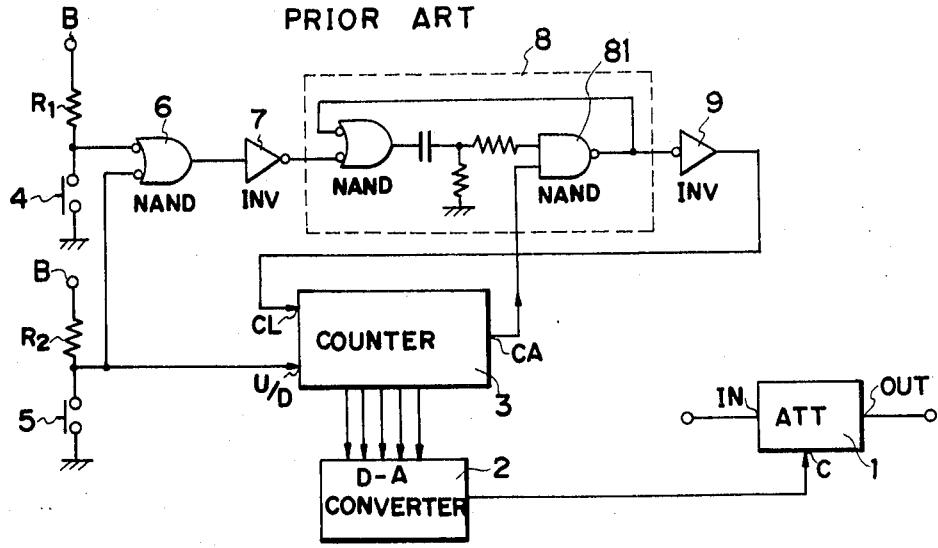
FIG. 1 is a circuit diagram of a conventional volume control apparatus.
Figure 2:
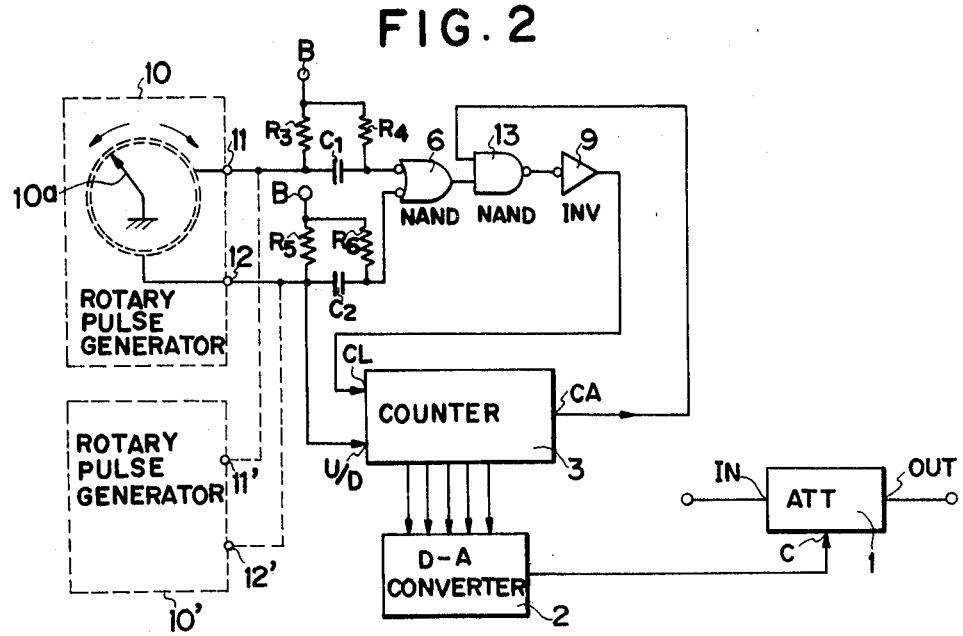
FIG. 2 is a circuit diagram of a volume control apparatus in accordance with the present invention.

Referring now to FIG. 2, there is illustrated a preferred embodiment of the present invention. In FIG. 2, the same or similar parts or portions as or to those in FIG. 1 are designated by the same or similar references.

10 is a rotary pulse generator which generates a low-level pulse output at either a first output terminal 11 or a second output terminal 12 according to a direction of rotation of a slide terminal 10a by an operating knob (not shown). This pulse output is generated every rotational angle of the operating knob. The rotary pulse generator 10 may be a pulse generator commonly used for manual tuning in a PLL synthesizer type electronic tuning radio. The first output terminal 11 of this rotary pulse generator 10 is coupled to an input terminal of an NAND circuit 6 through a capacitor $C_1$, and the second terminal 12 is coupled to an up/down control terminal U/D of an up/down counter 3 and further to another input of the NAND circuit 6 through a capacitor $C_2$. Opposite ends of each of the cpacitors $C_1$ and $C_2$ are coupled to power sources B, respectively, through resistors $R_3$ and $R_4$ and resistors $R_5$ and $R_6$, respectively. An output terminal of the NAND Circuit 6 is coupled to an input terminal of another NAND circuit 13. Another input terminal of this NAND circuit 13 is coupled to a carry terminal CA of the up/down counter 3. An output terminal of the NAND circuit 13 is coupled to a clock input terminal CL of the counter 3 through an inverter 9.

With the arrangement as described above, the volume control apparatus of the present invention operates as will be described hereinafter.

When the operating knob of the rotary pulse generator 10 is rotated clockwise, a low-level pulse output appears at the first output terminal 11. This output is inputted to the NAND circuit 6 through the capacitor $C_1$ and applied to the clock input terminal CL of the up/down counter 3 through the NAND circuit 13 and the inverter 9. The up/down control terminal U/D is not applied with a pulse (up/down control signal) and is thus kept at a high level. As a result, the up/down counter 3 counts the output pulse in an adding direction. When the operating knob of the rotary pulse generator 10 is rotated in the opposite direction, counter-clockwise, a low-level pulse output appears at the second output terminal 12. This output is applied to the clock input terminal CL through the capacitor $C_2$, the NAND circuti 6, the NAND circuit 13 and the inverter 9 and is also applied to the up/down control terminal U/D. Thus, since the low-level pulse is concurrently applied to the clock input terminal CL and the up/down control terminal U/D, the up/down counter 3 counts the pulse output in a subtracting direction.

When the operating knob of the rotary pulse generator 10 is rotated rapidly, a pulse output appears thickly so that a count output of the up/down counter 3 changes quickly. On the other hand, when the operating knob is rotated slowly, the pulse output appears thinly so that the count output from the up/down counter 3 is changed slowly. Thus, the volume obtained at the audio output terminal OUT of an electronic attenuator 1 in response to the count output from the up/down counter 3 can be changed rapidly or slowly according to the operation of the operating knob.

When the up/down counter 3 reaches a maximum count value or minimum count value, a low level signal (inhibiting signal) appears at the carry terminal CA to close a gate of the NAND circuit 13. Thus, the pulse output from the rotary pulse generator 10 is prevented from being inputted to the up/down counter 3, so that the up/down counter 3 maintains the maximum count value or the minimum count value.

A plurality of rotary pulse generators may be employed. For example, in case where the volume control apparatus of the present invention is used for a car acoustic equipment, one of the rotary pulse generator 10 may be mounted in a body of the acoustic equipment so that the car driver may carry out a volume control operation, and another rotary pulse generator 10' may be provided at a rear seat so as to allow the occupant of the rear seat to carry out volume control, too.

The rotary pulse generator employable in the present invention is not limited to that described above, but it may be any type of pulse generator which has a pulse generation amount control means and is capable of producing a pulse from the first or second output terminal according to the operation direction of the means, by every given operation amount.

As described above, according to the present invention, volume increase or decrease can be carried out rapidly or slowly according to necessity by the operation of the operating knob of the rotary pulse generator.

I claim:

1. A volume control apparatus which comprises:
an up/down counter having a clock input terminal, an up/down control terminal and a digital count output;
D/A converter means for converting said digital count output from said counter into an analog signal;
attenuator means responsive to said analog signal for controlling the degree of attenuation of an input signal;
rotary pulse generator means having a first output terminal, a second output terminal and a rotary operating knob for producing pulses on said first output terminal in response to rotation of said knob in one direction and for producing pulses on said second output terminal in response to rotation of said knob in a second direction opposite to said one direction, a said pulse being generated each time said knob is rotated through a given rotation angle and the frequency of said pulses depending on the rotational speed of said knob; and
logic circuit means coupled to said first and second output terminals of said pulse generator means for supplying said pulses from either of said output terminals to said clock input terminal of said counter, said up/down control terminal of said counter being coupled to one said output terminal of said generator to effect up/down count control of said counter.

2. A volume control apparatus according to claim 1, including a plurality of said rotary pulse generator means, said output terminals thereof being connected in parallel.

3. A volume control system according to claim 1, wherein said counter has a carry terminal and produces an inhibit signal at said carry terminal when said counter reaches a maximum count value and when said counter reaches a minimum count value, and wherein said logic circuit means inhibits said supplying of said pulses to said clock input terminal of said counter in response to the presence of the said inhibit signal.

4. A volume control system according to claim 3, wherein said logic circuit means includes a first and a second NAND gate, the input terminals of said first NAND gate respectively being coupled to said first and second output terminals of said rotary pulse generator means through respective capacitors and to power sources through respective resistors, the input terminals of said second NAND gate respectively being coupled to the output of said first NAND gate and said carry terminal of said counter.

5. A volume apparatus according to claim 4, including an inverter, the output terminal of said second NAND gate being coupled to the input terminal of said inverter and the output terminal of said inverter being coupled to said clock input terminal of said counter.

* * * * *